(12) United States Patent
Nakano et al.

(10) Patent No.: US 8,014,638 B2
(45) Date of Patent: Sep. 6, 2011

(54) SIGNAL TRANSMISSION DEVICE

(75) Inventors: Yoshiaki Nakano, Tokyo (JP); Xueliang Song, Tokyo (JP); Shurong Wang, Tokyo (JP)

(73) Assignee: The University of Tokyo, Tokyo (JP)

( * ) Notice: Subject to any disclaimer, the term of this patent is extended or adjusted under 35 U.S.C. 154(b) by 0 days.

(21) Appl. No.: 12/225,921

(22) PCT Filed: Mar. 30, 2007

(86) PCT No.: PCT/JP2007/057261
§ 371 (c)(1),
(2), (4) Date: Dec. 30, 2008

(87) PCT Pub. No.: WO2007/114384
PCT Pub. Date: Oct. 11, 2007

(65) Prior Publication Data
US 2009/0169219 A1 Jul. 2, 2009

(30) Foreign Application Priority Data
Apr. 3, 2006 (JP) ................................. 2006-102140

(51) Int. Cl.
G02B 6/12 (2006.01)
G02B 6/10 (2006.01)
(52) U.S. Cl. .......................................... 385/14; 385/130
(58) Field of Classification Search .................... None
See application file for complete search history.

(56) References Cited

U.S. PATENT DOCUMENTS

| | | | | |
|---|---|---|---|---|
| 5,054,870 A * | 10/1991 | Losch et al. | ..................... | 385/14 |
| 5,521,992 A * | 5/1996 | Chun et al. | ..................... | 385/14 |
| 5,780,875 A * | 7/1998 | Tsuji et al. | ..................... | 257/81 |
| 6,430,327 B1 * | 8/2002 | Kaneyama et al. | ............. | 385/14 |
| 6,552,366 B1 * | 4/2003 | Terada et al. | .................... | 257/84 |
| 6,798,932 B2 * | 9/2004 | Kuhara et al. | .................... | 385/14 |
| 6,804,444 B2 * | 10/2004 | Shin et al. | ...................... | 385/131 |
| 6,839,497 B2 * | 1/2005 | Park et al. | ...................... | 385/129 |
| 6,863,449 B2 * | 3/2005 | Kuhara et al. | .................... | 385/89 |
| 7,078,263 B2 * | 7/2006 | Dean | .............................. | 438/106 |
| 7,146,080 B2 * | 12/2006 | Neta et al. | ........................ | 385/40 |
| 7,310,457 B2 * | 12/2007 | Kotake | ............................. | 385/14 |
| 7,406,229 B2 * | 7/2008 | Bae et al. | ......................... | 385/47 |
| 7,522,648 B2 * | 4/2009 | Park et al. | ...................... | 372/50.1 |

(Continued)

FOREIGN PATENT DOCUMENTS
JP     A-09-61676     3/1997
(Continued)

*Primary Examiner* — Michelle R Connelly Cushwa
(74) *Attorney, Agent, or Firm* — Oliff & Berridge, PLC

(57) ABSTRACT

A signal transmission device includes a base plate and a photoelectric converter-sealed member. The base plate is structured to have an optical waveguide formed internally, an opening formed to expose the optical waveguide, and a mounting surface provided to allow an electronic part to be mounted thereon. The photoelectric converter-sealed member is placed in the opening of the base plate to include a photoelectric conversion module for making conversion between an electric signal and a light signal and provided by sealing at least the photoelectric conversion module with a predetermined material to expose at least part of a wiring from the photoelectric conversion module on a substantially identical plane with an opening end face of the opening of the base plate. The opening is either a recess or a through hole. This arrangement desirably ensures the higher-speed transmission of electric signals between the photoelectric conversion module and the LSI package.

5 Claims, 9 Drawing Sheets

U.S. PATENT DOCUMENTS

| | | |
|---|---|---|
| 2002/0137245 A1 | 9/2002 | Kitamura et al. |
| 2004/0028095 A1* | 2/2004 | Ishida et al. ............ 372/36 |
| 2004/0150081 A1 | 8/2004 | Ogawa |
| 2007/0019899 A1* | 1/2007 | Ohtsu et al. ............ 385/14 |

FOREIGN PATENT DOCUMENTS

| | | |
|---|---|---|
| JP | A-11-260969 | 9/1999 |
| JP | A-2001-174657 | 6/2001 |
| JP | A-2002-6161 | 1/2002 |
| JP | A-2002-6181 | 1/2002 |
| JP | A-2006-53472 | 2/2002 |
| JP | A-2002-111260 | 4/2002 |
| JP | A-2002-118271 | 4/2002 |
| JP | A-2002-343983 | 11/2002 |
| JP | A-2002-368334 | 12/2002 |
| JP | A-2004-6749 | 1/2004 |
| JP | A-2004-146603 | 5/2004 |
| JP | A-2004-281578 | 10/2004 |

* cited by examiner

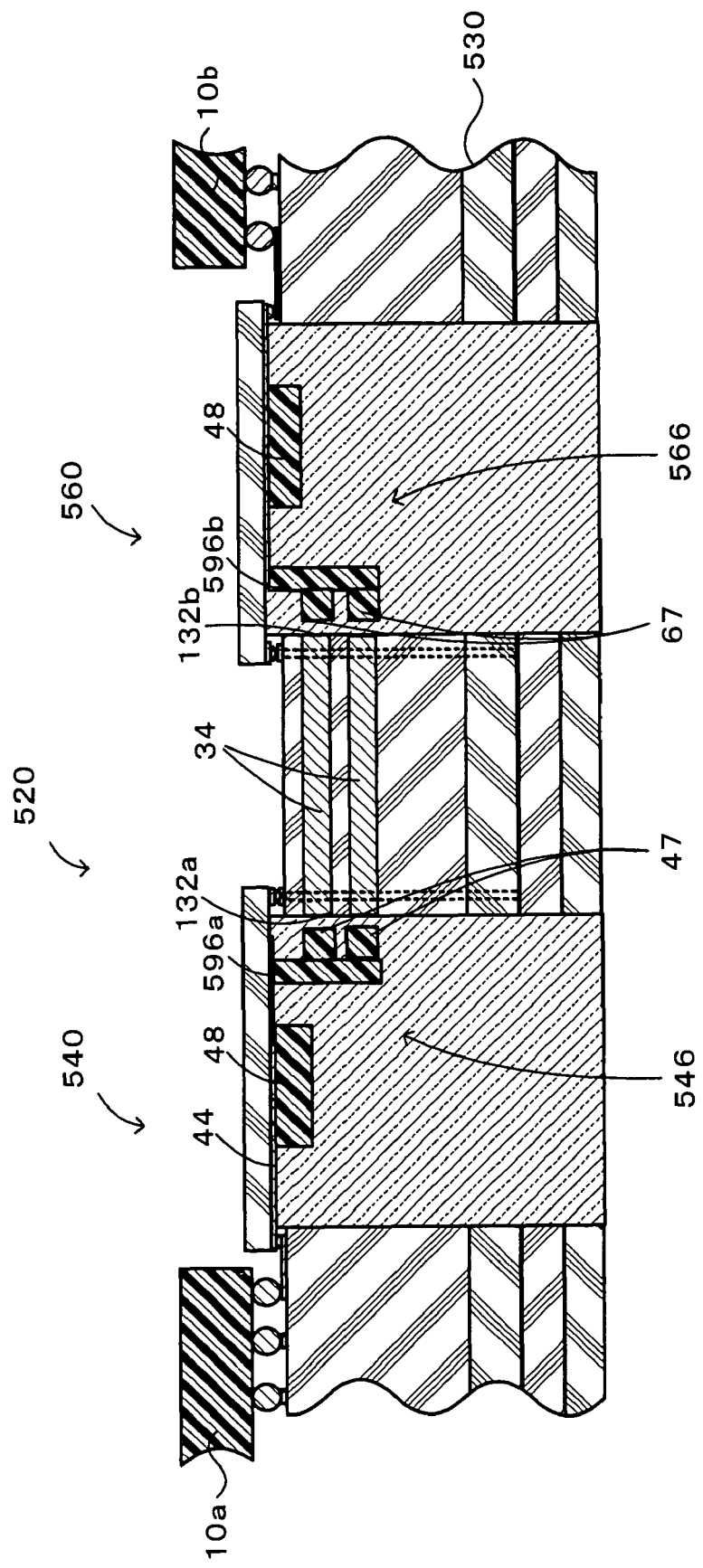

SIGNAL TRANSMISSION DEVICE

TECHNICAL FIELD

The present invention relates to a signal transmission device.

BACKGROUND ART

One proposed structure of a signal transmission device has a base plate with an internally formed optical waveguide. A light emitting element, such as a laser diode, of inputting light into the optical waveguide is placed in a recess formed in the direction of depth of the base plate from its surface (see, for example, Patent Document 1). In the signal transmission device of this prior art structure, an electronic part with a driving circuit for driving the light emitting element is mounted on a rear face of the base plate. This arrangement aims to shorten the wiring length of an electrical connection between the driving circuit of the electronic part and the light emitting element placed in the recess and thereby reduce a response delay of the light emitting element.

Patent Document 1: Japanese Patent Laid-Open No. 2001-174657 (FIG. 6)

DISCLOSURE OF THE INVENTION

The signal transmission device is generally desired to input and output electric signals at a higher speed from and to an electronic part, for example, an LSI (large scale integration) package, mounted on the base plate. The signal transmission device is also desired to be readily made an electrical connection with the mounted LSI package.

In the signal transmission device, there would thus be a demand for ensuring the higher-speed input and output of electric signals from and to a mounted electronic part. In the signal transmission device, there would also be a demand for facilitating an electrical connection with a mounted electronic part.

The present invention accomplishes at least part of the demand mentioned above and the other relevant demands by the following configurations applied to the signal transmission device.

According to one aspect, the invention is directed to a signal transmission device constructed to transmit a signal. The signal transmission device has: a base plate structured to have an optical waveguide formed internally, an opening formed to expose the optical waveguide, and amounting surface provided to allow an electronic part to be mounted thereon; and a photoelectric converter-sealed member placed in the opening of the base plate to include a photoelectric conversion module for making conversion between an electric signal and a light signal and provided by sealing at least the photoelectric conversion module with a predetermined material to expose at least part of a wiring from the photoelectric conversion module on a substantially identical plane with an opening end face of the opening of the base plate.

In the signal transmission device according to this aspect of the invention, the photoelectric converter-sealed member is placed at the opening of the base plate having the mounting surface for mounting the electronic part. The photoelectric converter-sealed member has the photoelectric conversion module designed to make conversion between electric signals and light signals. At least the photoelectric conversion module is sealed with the predetermined material in such a manner that at least part of the wiring from the photoelectric conversion module is exposed on the substantially same plane as the opening end face of the opening of the base plate. Since at least part of the wiring from the photoelectric conversion module is exposed on the substantially identical plane with the opening end face of the opening of the base plate, an electrical connection between the wiring from the photoelectric conversion module and the electronic part mounted on the base plate is made on the substantially same plane as the opening end face of the opening of the base plate. This arrangement ensures the higher-speed input and output of electric signals from and to the mounted electronic part. The exposure of the wiring from the photoelectric conversion module on the substantially same plane as the opening end face of the opening of the base plate facilitates the electrical connection with the electronic part mounted on the base plate. The predetermined material may be any of various materials, for example, a translucent epoxy resin or a non-translucent epoxy resin. Typical examples of the electronic part include an LSI, an IC (integrated circuit), a capacitor chip, a resistor chip, and an electric connector electrically connectable with a cable of another device.

In one preferable application of the signal transmission device according to this aspect of the invention, the photoelectric converter-sealed member is formed by sealing the opening of the base plate with the predetermined material to locate the opening of the base plate on a substantially identical plane with the mounting surface of the base plate for mounting the electronic part in such a manner that the photoelectric conversion module and the wiring, which are placed in the opening of the base plate. Sealing the opening of the base plate with the predetermined material to make the opening on the substantially same plane as the mounting surface for mounting the electronic part allows the electronic part to be hung over the opening on the base plate. This arrangement desirably increases the packaging density of the electronic part.

In one preferable embodiment of the invention, the signal transmission device further has: a radiator member attached to a rear face of the base plate opposed to the mounting surface of the base plate for mounting the electronic part; and a heat radiation wiring arranged to connect the radiator member with the photoelectric conversion module in a thermally conductive manner. This arrangement enables heat produced by the photoelectric conversion module to be released by the radiator member via the heat radiation wiring and prevents a significant temperature rise of the photoelectric conversion module.

In another preferable application of the signal transmission device according to the above aspect of the invention, the photoelectric converter-sealed member has a module mount designed to have the photoelectric conversion module and the wiring attached thereto and to work in cooperation with the predetermined material to seal the photoelectric conversion module. The use of the module mount enables the wiring from the photoelectric conversion module to be arranged on the substantially same plane as the opening end face of the opening. This arrangement allows an electrical connection with the electronic part mounted on the base plate to be made on the substantially same plane as the opening end face, thus ensuring the higher-speed input and output of electric signals from and to the electronic part. In this application, the module mount may have a connection terminal arranged to electrically connect the wiring with a terminal provided at an outer circumference of at least part of the opening on the mounting surface of the base plate. The use of the connection terminal provided on the module mount facilitates the electrical connection of the wiring from the photoelectric conversion module with the mounted electronic part.

In one preferable embodiment of the signal transmission device of the invention, the photoelectric conversion module has a photoelectric conversion element arranged to allow input and output of a light signal from and to the optical waveguide and make conversion between the light signal and an electric signal, and an electronic circuit designed to input and output the electric signal from and to the photoelectric conversion element. In this embodiment, the photoelectric conversion module has the electronic circuit located close to the photoelectric conversion element and linearly connected with the photoelectric conversion element by means of an inner-module wiring. This arrangement desirably shortens the wiring length of the inner-module wiring and ensures the high-speed input and output of electric signals between the photoelectric conversion element and the electronic circuit, compared with an arrangement of the electronic circuit at a position relatively farther from the photoelectric conversion element and a non-linear connection between the photoelectric conversion element and the electronic circuit by the inner-module wiring. The 'photoelectric conversion element' includes a light emitting element of converting an input electric signal into a light signal and a light receiving element of converting an input light signal into an electric signal. The 'electronic circuit' includes a driving circuit designed to output the electric signal to the light emitting element and thereby drive the light emitting element and an amplification circuit designed to amplify the electric signal input from the light receiving element.

In one preferable embodiment of the signal transmission device of the invention having any of the above configurations, the opening is either a recess formed in a direction of depth of the base plate from the mounting surface for mounting the electronic part or a through hole pierced from the mounting surface to a rear face of the base plate opposed to the mounting surface.

In the signal transmission device of the invention having any of the above configurations, the optical waveguide may be formed in a planar direction of the base plate. This arrangement enables propagation of the light signal in the planar direction of the base plate.

BRIEF DESCRIPTION OF THE DRAWINGS

FIG. 9 shows the schematic configuration of a signal transmission device 520 in still another modified example.

BEST MODES OF CARRYING OUT THE INVENTION

Some modes of carrying out the invention are described below as preferred embodiments with reference to the accompanied drawings.

Figure 1:
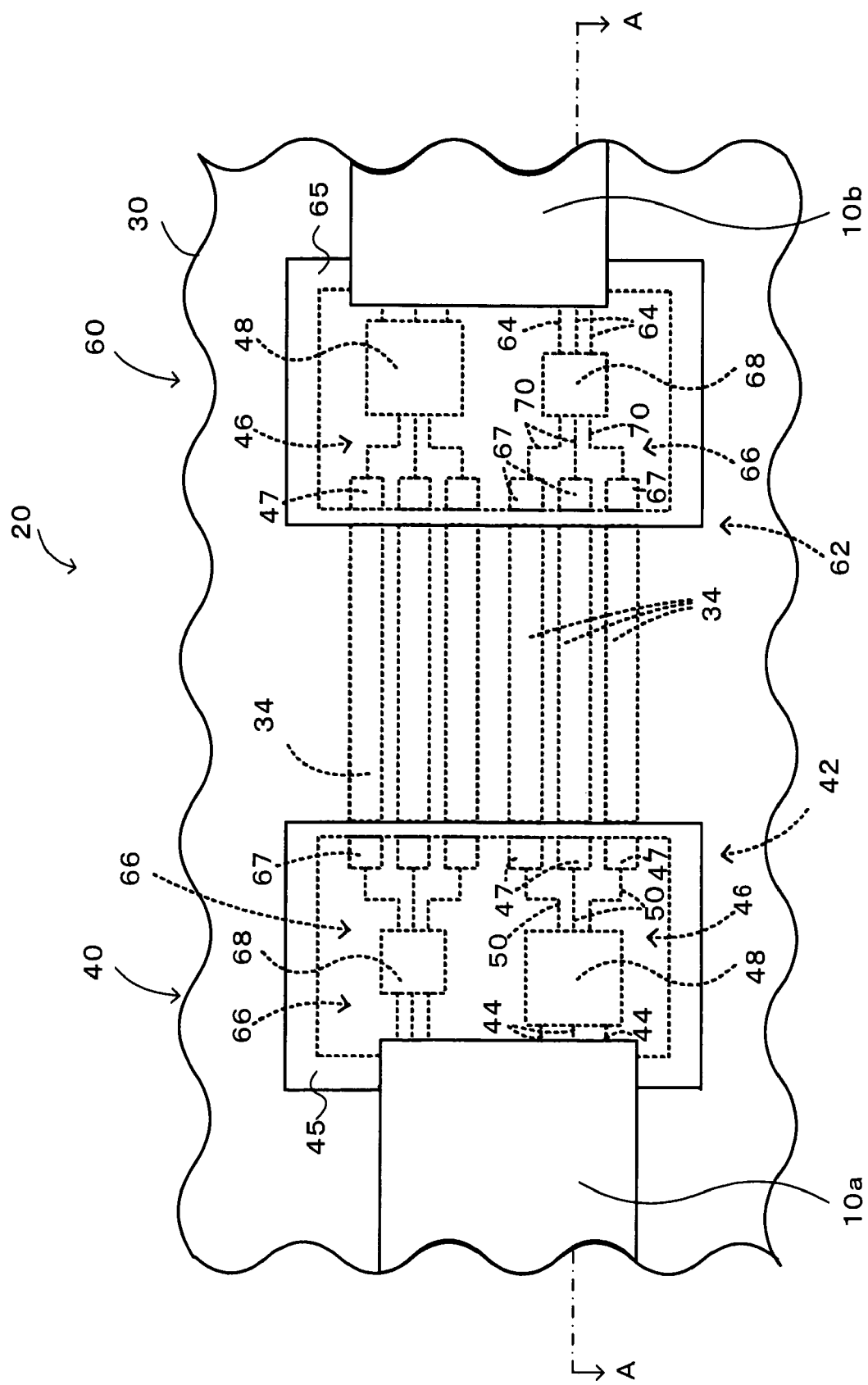
FIG. 1 is a plan view showing the schematic configuration of a signal transmission device 20 equipped with LSI packages 10a and 10b in a first embodiment of the invention.
Figure 2:
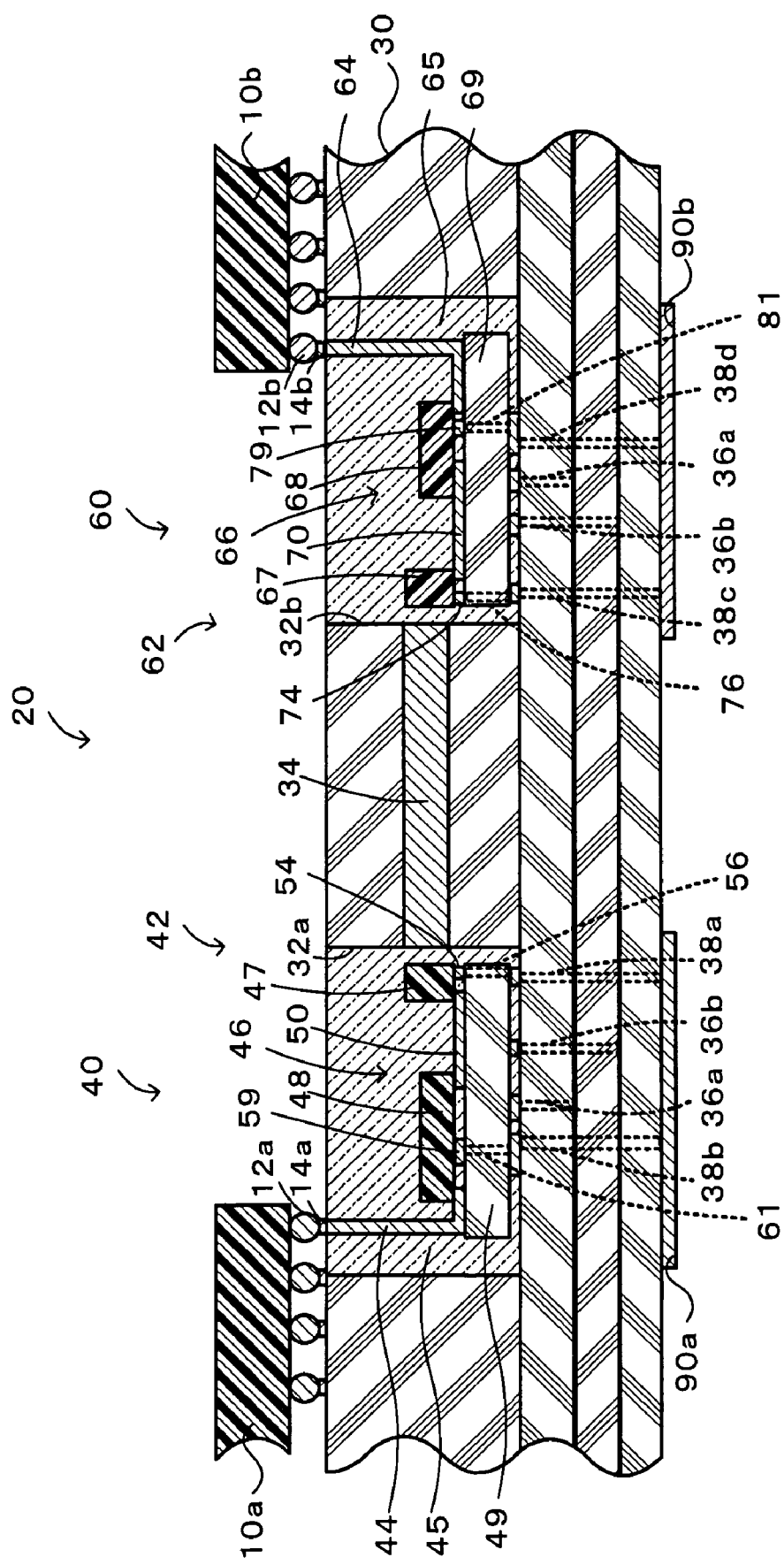
FIG. 2 is a sectional view showing a cross section of the signal transmission device 20, taken on a line A-A in FIG. 1.

FIG. 1 is a plan view showing the schematic configuration of a signal transmission device 20 equipped with LSI packages 10a and 10b having multiple data input and output pins and power supply pins and designed to transmit signals input from and output to the LSI packages 10a and 10b as a first embodiment of the invention. FIG. 2 is a sectional view showing a cross section of the signal transmission device 20, taken on a line A-A in FIG. 1. The signal transmission device 20 has a base plate 30, photo electric converter-sealed members 40 and 60, and radiator members 90a and 90b attached to a rear face of the base plate 30. The base plate 30 has recesses 32a and 32b formed in its depth direction from its mounting surface. The LSI packages 10a and 10b are mounted on the signal transmission device 20 to be partially hung over the recesses 32a and 32b. Photoelectric conversion modules 42 and 62 are respectively arranged in the recesses 32a and 32b to make conversion between electric signals and light signals input from and output to the LSI packages 10a and 10b and are sealed in the photoelectric converter-sealed members 40 and 60.

The base plate 30 is constructed as a multi-layered circuit board with six optical waveguides 34 arranged substantially in parallel in its planar direction for propagation of light. The recesses 32a and 32b are formed to expose respective opposite ends of the six optical waveguides 34. Each of the optical waveguides 34 is constructed as a light waveguide where a core (not shown) made of a material having a relatively high refractive index is surrounded by a clad (not shown) made of a material having a lower refractive index than the material of the core. Light is propagated mainly through the core. The base plate 30 also has power supply wirings 36a and 36b connected with a power supply source (not shown) mounted on the surface of the base plate 30 and with a ground (not shown) and laid internally to supply a power supply potential and a ground potential to the photoelectric conversion modules 42 and 62. The base plate 30 further has heat radiation wirings 38a, 38b, 38c, and 38d arranged to connect the photoelectric conversion modules 42 and 62 with the radiator members 90a and 90b on the rear face of the base plate 30 in a thermally conductive manner.

In the photoelectric converter-sealed members 40 and 60, the recesses 32a and 32b are sealed with resin sealers 45 and 65 of a translucent epoxy resin in such a manner that wirings 44 and 64 extended upward from the photoelectric conversion modules 42 and 62 are exposed to opening end faces of the recesses 32a and 32b, that is, top faces of the recesses 32a and 32b placed in the practically same plane as the surface of the base plate 30. Any suitable method may be adopted to seal the recesses 32a and 32b with the resin sealers 45 and 65. One available method places the photoelectric conversion modules 42 and 62 on the bottoms of dies having a substantially identical shape with that of the recesses 32a and 32b, pours the translucent epoxy resin into the dies to be cured, and inserts the cured resin parts including the photoelectric conversion modules 42 and 62 in the recesses 32a and 32b. Another available method places the photoelectric conversion modules 42 and 62 in the bottoms of the recesses 32a and 32b and pours the translucent epoxy resin into the recesses 32a and 32b to be cured. The detailed structures of the photoelectric conversion modules 42 and 62 will be discussed later.

A terminal 14a is provided on the wiring 44 exposed on the opening end face of the recess 32a, and a signal pin 12a of the LSI package 10a is placed on the terminal 14a. The wiring 44, the terminal 14a, and the signal pin 12 are thus electrically connected to allow the photoelectric conversion module 42 to input and output electric signals from and to the LSI package 10a via the wiring 44, the terminal 14a, and the signal pin 12a. Similarly a terminal 14b and a signal pin 12b of the LSI package 10b are sequentially placed on the wiring 64 exposed on the opening end face of the recess 32b. The wiring 64, the terminal 14b, and the signal pin 12b are thus electrically connected to allow the photoelectric conversion module 62 to input and output electric signals from and to the LSI package 10b via the wiring 64, the terminal 14b, and the signal pin 12b. In the structure of the first embodiment, the wirings 44 and 64 from the photoelectric conversion modules 42 and 62 are exposed on the respective opening end faces of the recesses 32a and 32b to be arranged in the substantially same plane. It is thus not necessary to make wirings from the photoelectric conversion modules 42 and 62 internally laid in the base plate 30 as in the conventional structure of the base plate. This arrangement desirably shortens the wiring lengths from the photoelectric conversion module 42 to the LSI package 10a and from the photoelectric conversion module 62 to the LSI package 10b, compared with the conventional structure with the wirings from the photoelectric conversion modules internally laid in the base plate. The shorter wiring lengths allow relatively high-speed input and output of electric signals between the photoelectric conversion module 42 and the LSI package 10a and between the photoelectric conversion module 62 and the LSI package 10b. The recesses 32a and 32b are sealed to make the opening end faces of the recesses 32a and 32b in the substantially same plane as the mounting surface of the base plate 30. As shown in FIGS. 1 and 2, the LSI packages 10a and 10b may thus be arranged to be partially hung over the recesses 32a and 32b. This arrangement effectively increases the packaging density, compared with the conventional structure of the base plate that does not allow LSI packages to be hung over the recesses 32a and 32b. The signal pins 12a and 12b of the LSI packages 10a and 10b having the relatively high-speed signal input and output capabilities are placed over the corresponding recesses 32a and 32b. Among signal pins of the LSI packages 10a and 10b, pins (not shown) connecting with the power supply source, grounded pins (not shown), and signal pins (not shown) having the relatively low-speed signal input and output capabilities are arranged not to be placed over the recesses 32a and 32b. These pins arranged not to be placed over the recesses 32a and 32b are connected with an electrode pattern formed on the surface of the base plate 30. The reason for such arrangement of the LSI packages 10a and 10b on the base plate 30 will be explained later.

The detailed structures of the photoelectric conversion modules 42 and 62 are described below.

Each of the photoelectric conversion modules 42 and 62 has an electric-optical converter 46 designed to convert electric signals to light signals and an optical-electric converter 66 designed to convert light signals to electric signals. The electric-optical converter 46 of the photoelectric conversion module 42 is arranged to face the optical-electric converter 66 of the photoelectric conversion module 62 across three optical waveguides 34 among the six optical waveguides 34. The optical-electric converter 66 of the photoelectric conversion module 42 is arranged to face the electric-optical converter 46 of the photoelectric conversion module 62 across the other three optical waveguides 34.

The electric-optical converter 46 of the photoelectric conversion module 42 and the optical-electric converter 66 of the photoelectric conversion module 62 are described in detail below.

The electric-optical converter 46 has laser diodes 47 positioned to enable light to enter the corresponding optical waveguides 34 exposed to the recess 32a, a driving IC 48 used to drive the laser diodes 47, and an interposer 49 provided as a printed circuit board with the laser diodes 47 and the driving IC 48 placed on the surface thereof.

The laser diodes 47 are electrically connected with the driving IC 48 by patterned wirings 50 formed on the surface of the interposer 49 or by wire bonding (not shown). The laser diodes 47 are electrically connected with internal wiring for power supply (not shown) in the interposer 49, which is electrically connected with the power supply wirings 36a and 36b of the base plate 30, and receive a required supply of electric power through the power supply wirings 36a and 36b. The main body of each laser diode 47 is attached to a heat radiation electrode 54 formed on the surface of the interposer 49 to allow transmission of heat of the laser diode 47. The heat radiation electrode 54 is connected in a thermally conductive manner with heat radiation internal wiring 56 of the interposer 49, which is connected in a thermally conductive manner with the heat radiation wiring 38a of the base plate 30. Heat is accordingly conducted from the laser diodes 47 to the radiator member 90a via the heat radiation electrodes 54, the heat radiation internal wirings 56, and the heat radiation wirings 38a. Namely the radiator member 90a releases the heat of the laser diodes 47 and accordingly prevents a significant temperature rise of the laser diodes 47.

The driving IC 48 is electrically connected with the wiring 44 exposed on the recess 32a. A relatively high-speed electric signal is input from the signal pin 12a of the LSI package 10a into the driving IC 48. The driving IC 48 is electrically connected with the internal wiring for power supply (not shown) in the interposer 49, which is electrically connected with the power supply wirings 36a and 36b of the base plate 30, and receives a required supply of electric power through the power supply wirings 36a and 36b. The main body of the driving IC 48 is attached to a heat radiation electrode 59 formed on the surface of the interposer 49. The heat radiation electrode 59 is connected in a thermally conductive manner with heat radiation internal wiring 61 of the interposer 49, which is connected in a thermally conductive manner with the heat radiation wiring 38b of the base plate 30. Heat is accordingly conducted from the driving IC 48 to the radiator member 90a via the heat radiation electrode 59, the heat radiation internal wiring 61, and the heat radiation wiring 38b. Namely the radiator member 90a releases the heat of the driving IC 48 and accordingly prevents a significant temperature rise of the driving IC 48.

The optical-electric converter 66 has photo diodes 67 positioned to receive light emitted from the end faces of the corresponding optical waveguides 34 exposed to the recess 32b, an amplification IC 68 used to amplify electric signals output from the photo diodes 67, and an interposer 69 provided as a printed circuit board with the photo diodes 67 and the amplification IC 68 placed on the surface thereof.

The photo diodes 67 are electrically connected with the amplification IC 68 by patterned wirings 70 formed on the surface of the interposer 69 or by wire bonding (not shown). The photo diodes 67 are electrically connected with internal wiring for power supply (not shown) in the interposer 69, which is electrically connected with the power supply wirings 36a and 36b of the base plate 30, and receive a required supply of electric power through the power supply wirings 36a and 36b. The main body of each photo diode 67 is attached to a heat radiation electrode 74 formed on the surface of the interposer 69. The heat radiation electrode 74 is connected in a thermally conductive manner with heat radiation internal wiring 76 of the interposer 69, which is connected in a thermally conductive manner with the heat radiation wiring 38c of the base plate 30. Heat is accordingly conducted from the photo diodes 67 to the radiator member 90b via the heat radiation electrodes 74, the heat radiation internal wirings 76, and the heat radiation wirings 38c. Namely the radiator member 90b releases the heat of the photo diodes 67 and accordingly prevents a significant temperature rise of the photo diodes 67.

The amplification IC 68 is electrically connected with the wiring 64 exposed on the recess 32b to output an electric signal to the signal pin 12b of the LSI package 10b. The amplification IC 68 is electrically connected with the internal wiring for power supply (not shown) in the interposer 69, which is electrically connected with the power supply wirings 36a and 36b of the base plate 30, and receives a required supply of electric power through the power supply wirings 36a and 36b. The main body of the amplification IC 68 is attached to a heat radiation electrode 79 formed on the surface of the interposer 69 in a thermally conductive manner. The heat radiation electrode 79 is connected in a thermally conductive manner with heat radiation internal wiring 81 of the interposer 69, which is connected in a thermally conductive manner with the heat radiation wiring 38d of the base plate 30. Heat is accordingly conducted from the amplification IC 68 to the radiator member 90b via the heat radiation electrode 79, the heat radiation internal wiring 81, and the heat radiation wiring 38d. Namely the radiator member 90b releases the heat of the amplification IC 68 and accordingly prevents a significant temperature rise of the d amplification IC 68.

In the signal transmission device 20 of the first embodiment constructed as described above, the electric signal output from the signal pin 12a of the LSI package 10a enters the signal pin 12b of the LSI package 10b according to a series of operations described below.

The electric signal output from the signal pin 12a of the LSI package 10a enters the driving IC 48 of the electric-optical converter 46 in the photoelectric conversion module 42. The driving IC 48 drives the laser diode 47, in response to the input electric signal. The driven laser diode 47 then outputs a light signal corresponding to the input electric signal. The electric signal input from the signal pin 12a is thus converted into the light signal by the electric-optical converter 46. The converted light signal passes through the exposed end of the optical waveguide 34 to the recess 32a to enter the optical waveguide 34, is propagated through the optical waveguide 34, and is output from the opposite exposed end of the optical waveguide 34 on the recess 32b. The light signal output from the optical waveguide 34 is received by the photo diode 67 of the optical-electric converter 66 in the photoelectric conversion module 62. The photo diode 67 outputs an electric signal corresponding to the received light signal to the amplification IC 68. The amplification IC 68 amplifies the input electric signal. The light signal output from the optical waveguide 34 is thus converted into the electric signal by the optical-electric converter 66. The converted electric signal is input into the signal pin 12b of the LSI package 10b. The signal transmission device 20 of the embodiment transmits the electric signal in the form of the light signal in the above manner on the route from the signal pin 12a of the LSI package 10a to the signal pin 12b of the LSI package 10b. This characteristic of the signal transmission device 20 accomplishes the higher-speed signal transmission, compared with the conventional printed circuit board with only the standard electric wirings.

The photoelectric conversion modules 42 and 62 and the optical waveguides 34 of the base plate 30 are activated to transmit only the relatively high-speed signals from the signal pin 12a of the LSI package 10a having the relatively high-speed signal input and output capability. The electrode pattern formed on the mounting surface of the base plate 30 is used, on the other hand, to transmit the power supply potential from the power supply pin and the low-speed signals from the signal pin having the low-speed signal input and output capability. Namely the photoelectric conversion modules 42 and 62 and the optical waveguides 34 are used only for the signals requiring high-speed transmission.

As described above, in the signal transmission device 20 of the first embodiment, the wirings 44 and 64 from the photoelectric conversion modules 42 and 62 are exposed on the respective opening end faces of the recesses 32a and 32b to be arranged in the substantially same plane. This arrangement desirably shortens the wiring lengths from the photoelectric conversion module 42 to the LSI package 10a and from the photoelectric conversion module 62 to the LSI package 10b, compared with the conventional structure with the wirings from the photoelectric conversion modules internally laid in the base plate. The shorter wiring lengths allow the higher-speed input and output of electric signals between the photoelectric conversion module 42 and the LSI package 10a and between the photoelectric conversion module 62 and the LSI package 10b. The wirings 44 and 64 from the photoelectric conversion modules 42 and 62 are exposed on the respective opening end faces of the recesses 32a and 32b to be arranged in the substantially same plane. Such exposure facilitates the connection of the photoelectric conversion module 42 with the signal pin 12a of the LSI package 10a via the terminal 14a, as well as the connection of the photoelectric conversion module 62 with the signal pin 12b of the LSI package 10b via the terminal 14b. The recesses 32a and 32b are sealed to make the opening end faces of the recesses 32a and 32b in the substantially same plane as the mounting surface of the base plate 30 for the LSI packages 10a and 10b. The LSI packages 10a and 10b can thus be placed to be partially hung over the corresponding recesses 32a and 32b. This increases the packaging density. The radiator members 90a and 90b attached to the rear face of the base plate 30 are used respectively to release the heat of the laser diodes 47 and the driving IC 48 and to release the heat of the photo diodes 67 and the amplification IC 68. This arrangement desirably prevents a significant temperature rise of the laser diodes 47 and the driving IC 48, as well as a significant temperature rise of the photo diodes 67 and the amplification IC 68.

In the signal transmission device 20 of the first embodiment, the LSI packages 10a and 10b are arranged to be partially hung over the respective recesses 32a and 32b. This arrangement is, however, neither essential nor restrictive. The LSI packages 10a and 10b may be arranged not to be hung over the respective recesses 32a and 32b.

In the signal transmission device 20 of the first embodiment, the recesses 32a and 32b are sealed such as to make the wirings 44 and 64 from the photoelectric conversion modules 42 and 62 extended upward from the interposers 49 and 69 of the photoelectric conversion modules 42 and 62 and exposed on the respective opening end faces of the recesses 32a and 32b. This arrangement is, however, neither essential nor restrictive. Any other suitable arrangement or route is allowed, as long as the wirings 44 and 64 from the photoelectric conversion modules 42 and 62 are at least partly exposed on the respective opening end faces of the recesses 32a and 32b. For example, the wirings 44 and 64 from the photoelectric conversion modules 42 and 62 may be laid inside the interposers 49 and 69 to go through the respective bottoms of the recesses 32a and 32b and may be extended upward from spaces between a side wall of the recess 32a and the photoelectric conversion module 42 and between a side wall of the recess 32b and the photoelectric conversion module 62 to be exposed on the substantially same plane as the respective opening end faces of the recesses 32a and 32b. In another example, the wirings 44 and 64 from the photoelectric conversion modules 42 and 62 may be laid inside the interposers 49 and 69 and may be extended horizontally along the respective bottoms of the recesses 32a and 32b and upward along the respective side faces of the recesses 32a and 32b to be exposed on the substantially same plane as the respective opening end faces of the recesses 32a and 32b.

In the signal transmission device 20 of the first embodiment, the radiator members 90a and 90b are attached to the rear face of the base plate 30. The radiator members 90a and 90b and the heat radiation wirings 38a, 38b, 38c, and 38d may be omitted, when the heat generated by the laser diodes 47, the driving IC 48, the photo diodes 67, and the amplification IC 68 is a relatively small amount and does not require heat release. In this modified structure, the interposers 49 and 69 may not be equipped with the heat radiation electrodes 54, 59, 74, and 79 or the heat radiation internal wirings 56, 61, 76, and 81.

In the signal transmission device 20 of the first embodiment, the power supply wirings 36a and 36b are extended from the mounting surface of the base plate 30 for the LSI packages 10a and 10b to be laid inside the base plate 30 and arranged in the bottom faces of the recesses 32a and 32b. As long as the arrangement ensures the supply of electric power to the photoelectric conversion modules 42 and 62, the power supply wirings 36a and 36b may be extended from the surfaces of the photoelectric converter-sealed members 40 and 60 to be laid inside the resin sealers 45 and 65 and arranged on the surfaces of the interposers 49 and 69.

Figure 3:
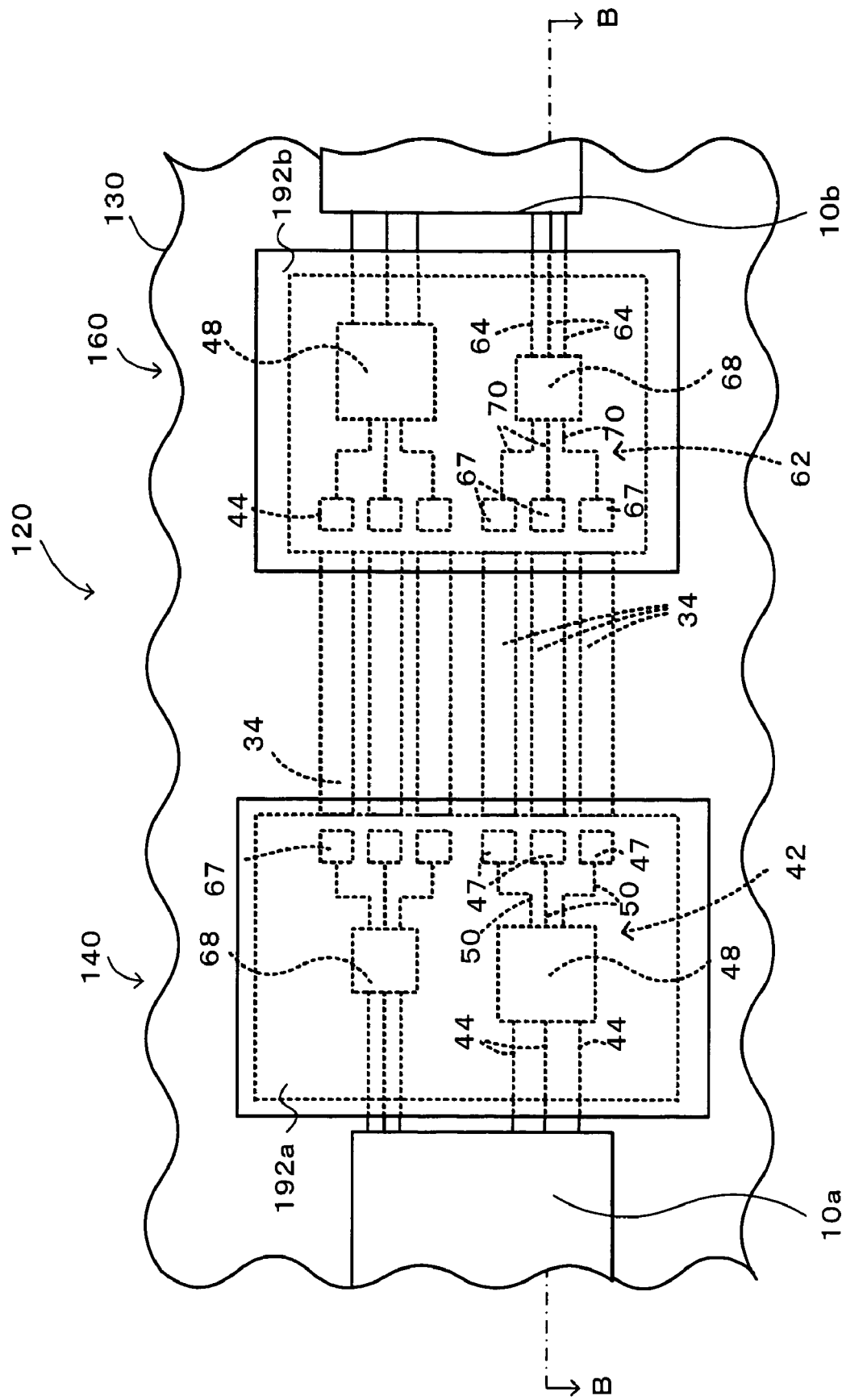
FIG. 3 is a plan view showing the schematic configuration of a signal transmission device 120 equipped with the LSI packages 10a and 10b in a second embodiment of the invention.
Figure 4:
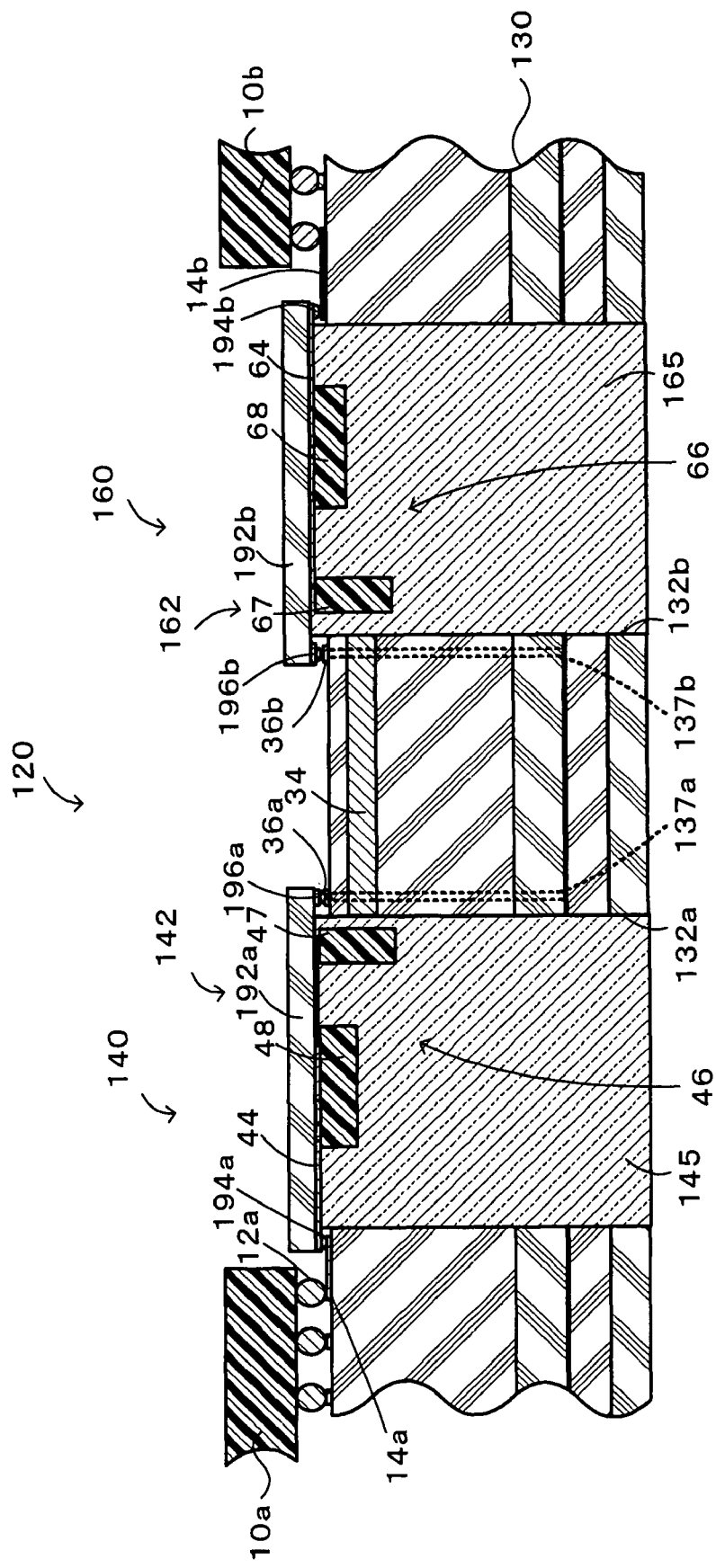
FIG. 4 is a sectional view showing a cross section of the signal transmission device 120, taken on a line B-B in FIG. 3.

A signal transmission device 120 is described below as a second embodiment of the invention. FIG. 3 is a plan view showing the schematic configuration of the signal transmission device 120 of the second embodiment. FIG. 4 is a sectional view showing a cross section of the signal transmission device 120, taken on a line B-B in FIG. 3. The signal transmission device 120 of the second embodiment has the common structure to that of the signal transmission device 20 of the first embodiment, for example, the LSI packages 10a and 10b mounted on a base plate. In order to avoid the repeated explanation, the like elements of the signal transmission device 120 of the second embodiment to those of the signal transmission device 20 of the first embodiment are expressed by the like numerals and are not specifically described here.

The signal transmission device 120 has a base plate 130 with through holes 132a and 132b penetrating from its mounting surface for the LSI packages 10a and 10b to its rear face, and photoelectric converter-sealed members 140 and 160 to seal therein photoelectric conversion modules 142 and 162, which are respectively arranged in the through holes 132a and 132b to make conversion between electric signals and light signals input from and output to the LSI packages 10a and 10b.

As illustrated, the base plate 130 is constructed as a multi-layered circuit board with six optical waveguides 34 and power supply wirings 36a and 36b in a similar manner to the structure of the base plate 30 in the signal transmission device 20 of the first embodiment. The through holes 132a and 132b are formed to expose respective opposite ends of the six optical waveguides 34. Terminals 14a and 14b are electrically connected with signal pins 12a and 12b of the LSI packages 10a and 10b and are provided on the respective outer circumferential faces of the through holes 132a and 132b on the surface of the substrate 130. The power supply wirings 36a and 36b pass through via holes 137a and 137b, which are formed in the base plate 130 to the depth of a wiring layer of internal wiring for power supply (not shown) and are exposed on the surface of the base plate 130.

The photoelectric conversion modules 142 and 162 of the photoelectric converter-sealed members 140 and 160 have similar structures to those of the photoelectric conversion modules 42 and 62 of the first embodiment, except omission of the interposers 49 and 69. As illustrated, in the photoelectric converter-sealed members 140 and 160, the photoelectric conversion modules 142 and 162 are sealed in the through holes 132a and 132b by means of module mounts 192a and 192b with the photoelectric conversion modules 142 and 162 mounted thereon and resin sealers 145 and 165 for sealing the through holes 132a and 132b. Wirings 44 and 64 from the photoelectric conversion modules 142 and 162 are exposed on the surfaces of the resin sealers 145 and 165, are extended to the outer circumferences of the throughholes 132a and 132b, and are attached to the module mounts 192a and 192b. Any suitable method may be adopted to form the photoelectric converter-sealed members 140 and 160. One available method places the photoelectric conversion modules 142 and 162 mounted on the module mounts 192a and 192b on the bottoms of dies having a substantially identical shape with that of the through holes 132a and 132b, pours a translucent epoxy resin into the dies to be cured, and inserts the cured resin parts including the photoelectric conversion modules 142 and 162 in the through holes 132a and 132b. In the illustration of FIG. 4, there are height differences between the opening end faces of the through holes 132a and 132b or the surface of the base plate 130 and the surfaces of the resin sealers 145 and 165. But the illustration of these height differences aims to clearly show the mounting positions of the wirings 44 and 64. In the actual state, however, the thicknesses of the wirings 44 and 64 and of connection terminals 194a and 194b are negligible compared with the thickness of the base plate 130. The surface of the base plate 130 or the opening end faces of the through holes 132a and 132b can thus be regarded to be in the substantially same plane as the surfaces of the resin sealers 145 and 165.

The extended ends of the wirings 44 and 64 to the outer circumferences of the through holes 132a and 132b are provided with the connection terminals 194a and 194b that are electrically connected to the terminals 14a and 14b of the base plate 130 and with connection terminals 196a and 196b that are electrically connected to internal wiring for power supply (not shown) to the photoelectric conversion modules 142 and 162 and to the power supply wirings 36a and 36b of the base plate 130. The photoelectric conversion module 142 inputs and outputs electric signals from and to the LSI package 10a via the wiring 44, the connection terminal 194a, the terminal 14a, and the signal pin 12a. Similarly the photoelectric conversion module 162 inputs and outputs electric signals from and to the LSI package 10b via the wiring 64, the connection terminal 194b, the terminal 14b, and the signal pin 12b. The connection terminals 194a, 194b, 196a, and 196b also have a function of inputting light signals from the laser diodes 47 of the photoelectric conversion modules 142 and 162 into the optical waveguides 34 and a function of adjusting the heights of the photoelectric conversion modules 142 and 162 to input the light signals from the optical waveguides 34 into the photo diodes 67. The wirings 44 and 64 from the photoelectric conversion modules 142 and 162 are exposed on the substantially same plane as the surface of the base plate 130 or the opening end faces of the through holes 132a and 132b. The wirings 44 and 64 are extended to the outer circumferences of the through holes 132a and 132b to connect the photoelectric conversion modules 142 and 162 with the LSI packages 10a and 10b on the surface of the base plate 130. This arrangement ensures the higher-speed input and output of electric signals between the photoelectric conversion module 142 and the LSI package 10a and between the photoelectric conversion module 162 and the LSI package 10b. It is thus not necessary to make wirings from the photoelectric conversion modules internally laid in the base plate as in the conventional structure of the base plate. This arrangement also ensures the higher-speed input and output of electric signals between the photoelectric conversion module 142 and the LSI package 10a and between the photoelectric conversion module 162 and the LSI package 10b. The wirings 44 and 64 from the photoelectric conversion modules 142 and 162 are exposed on the surfaces of the resin sealers 145 and 165 and are extended to the outer circumferences of the through holes 132a and 132b. The wirings 44 and 64 are then electrically connected with the signal pins 12a and 12b of the LSI packages 10a and 10b via the connection terminals 194a and 194b provided on the extended ends of the wirings 44 and 64 to the outer circumferences of the through holes 132a and 132b. This arrangement facilitates the connection between the wiring 44 and the signal pin 12a of the LSI package 10a and between the wiring 64 and the signal pin 12b of the LSI package 10b.

As described above, in the signal transmission device 120 of the second embodiment, the wirings 44 and 64 from the photoelectric conversion modules 142 and 162 are exposed on the substantially same plane as the opening end faces of the through holes 132a and 132b. The wirings 44 and 64 are extended to the outer circumferences of the through holes 132a and 132b to connect the photoelectric conversion modules 142 and 162 with the LSI packages 10a and 10b on the surface of the base plate 130. This arrangement ensures the higher-speed input and output of electric signals between the photoelectric conversion module 142 and the LSI package 10a and between the photoelectric conversion module 162 and the LSI package 10b. It is thus not necessary to make wirings from the photoelectric conversion modules and internally laid in the base plate as in the conventional structure of the base plate. This arrangement also ensures the higher-speed input and output of electric signals between the photoelectric conversion module 142 and the LSI package 10a and between the photoelectric conversion module 162 and the LSI package 10b. The wirings 44 and 64 from the photoelectric conversion modules 142 and 162 are exposed on the surfaces of the resin sealers 145 and 165 and are extended to the outer circumferences of the through holes 132a and 132b. The use of the connection terminals 194a and 194b provided on the extended ends of the wirings 44 and 64 to the outer circumferences of the through holes 132a and 132b facilitates the connection between the wiring 44 and the signal pin 12a of the LSI package 10a and between the wiring 64 and the signal pin 12b of the LSI package 10b.

Figure 5:
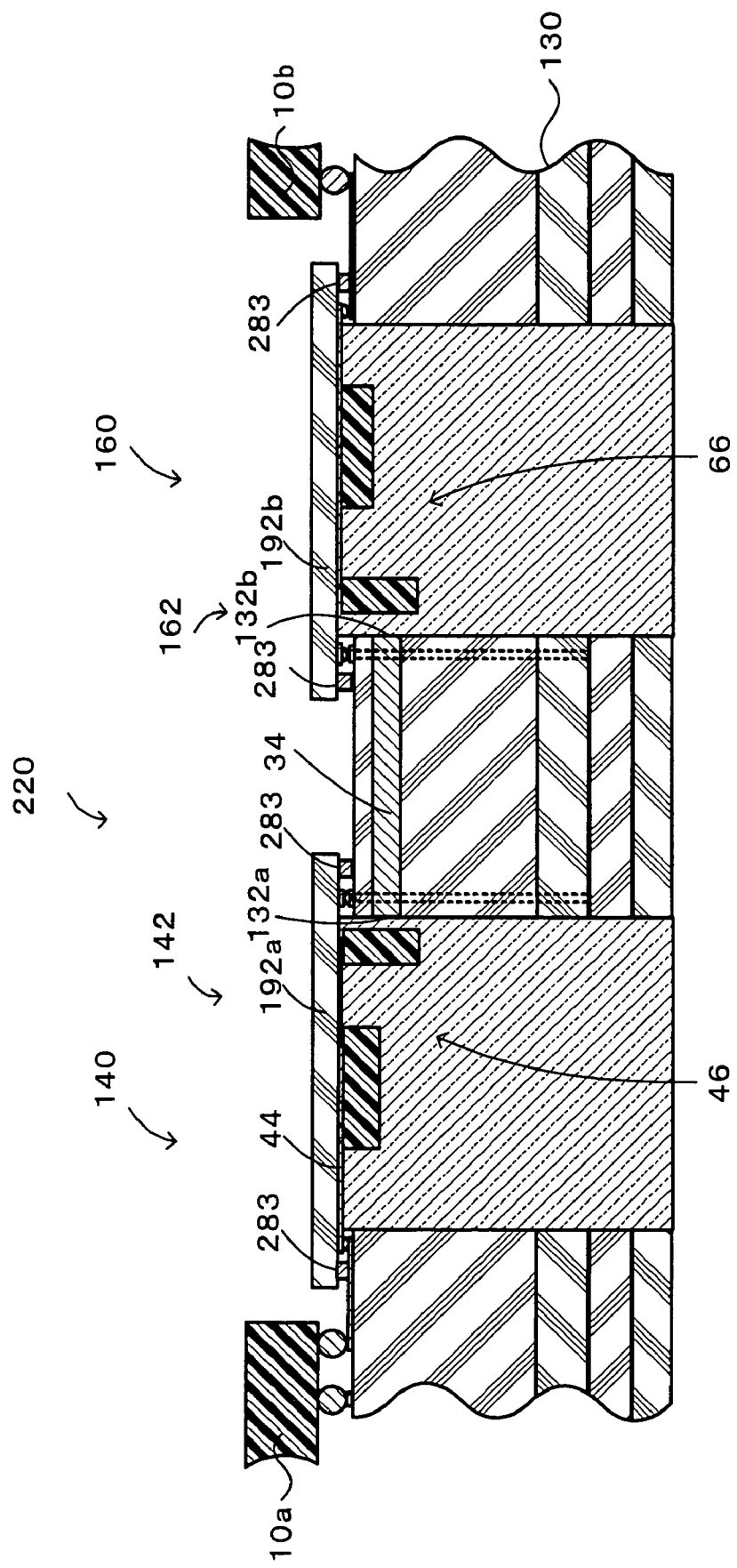
FIG. 5 shows the schematic configuration of a signal transmission device 220 in one modified example.

In the signal transmission device 120 of the second embodiment, the connection terminals 194a, 194b, 196a, and 196b function to electrically connect the LSI packages 10a and 10b with the photoelectric conversion modules 142 and 162, while adjusting the heights of the photoelectric conversion modules 142 and 162 to allow input of light signals from the laser diodes 47 of the photoelectric conversion module 142 to the optical waveguides 34 and output of light signals from the optical waveguides 34 to the photo diodes 67 of the photoelectric conversion module 162. The connection terminals 194a, 194b, 196a, and 196b may be designed to simply make electrical connections of the LSI packages 10a and 10b with the photoelectric conversion modules 142 and 162. The connection terminals 194a, 194b, 196a, and 196b may, however, not have the additional function of adjusting the heights of the photoelectric conversion modules 142 and 162 to allow input of light signals from the laser diodes 47 of the photoelectric conversion module 142 to the optical waveguides 34 and output of light signals from the optical waveguides 34 to the photo diodes 67 of the photoelectric conversion module 162. One example of such modification is given as a signal transmission device 220 shown in FIG. 5. In this modified structure, spacers 283 are attached to the module mounts 192a and 192b to adjust the heights of the laser diodes 47 of the photoelectric conversion module 142 and the photo diodes 67 of the photoelectric conversion module 162.

Figure 6:
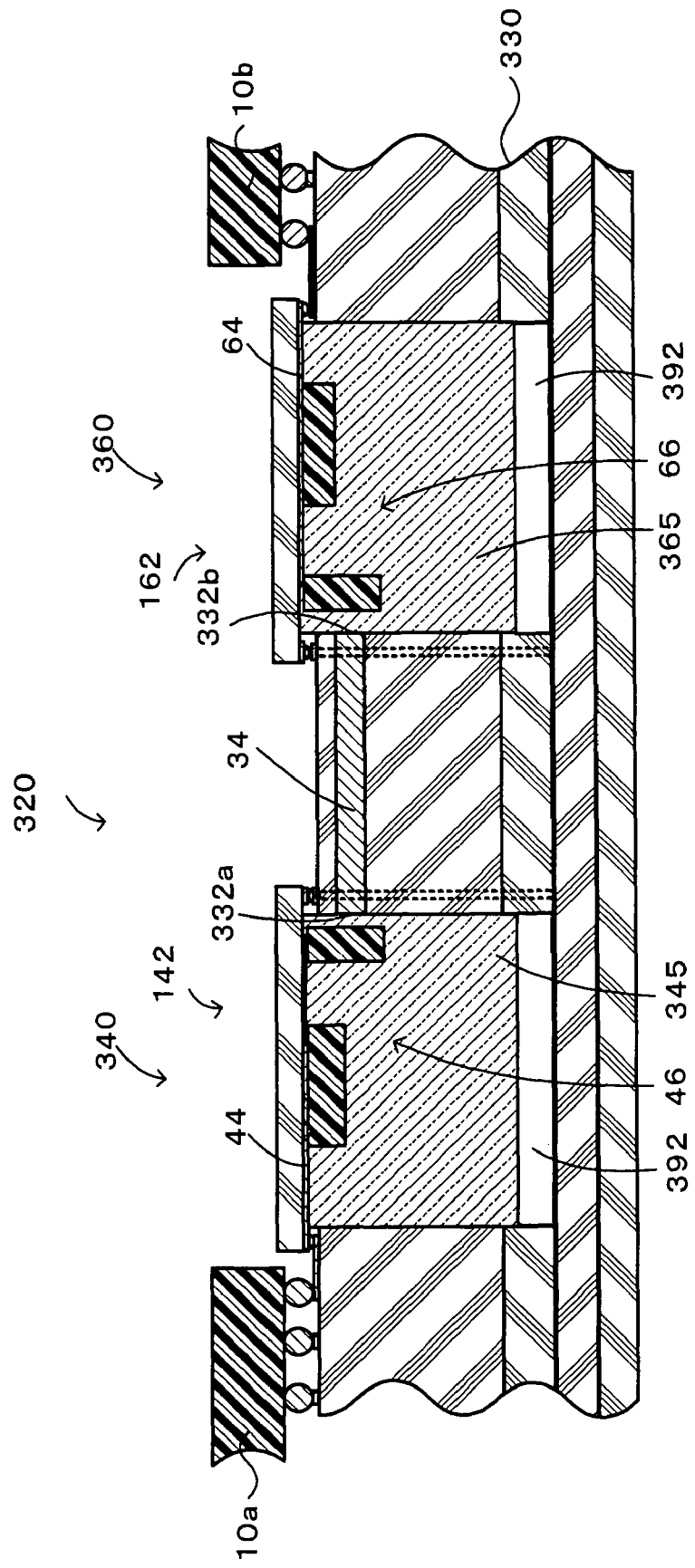
FIG. 6 shows the schematic configuration of a signal transmission device 320 in another modified example.

In the signal transmission device 120 of the second embodiment, the base plate 130 has the through holes 132a and 132b. FIG. 6 shows the structure of a signal transmission device 320 as one modified example with a base plate 330 and photoelectric converter-sealed members 340 and 360. Recesses 332a and 332b are formed from the surface of the base plate 330 in the direction of depth, in place of the through holes 132a and 132b. The photoelectric converter-sealed members 340 and 360 are designed arbitrarily to be placed in the recesses 332a and 332b and to seal the photoelectric conversion modules 142 and 162 with the resin sealers 345 and 365 and the module mounts 192a and 192b. There may be gaps 392 between the resin sealer 345 and the bottom of the recess 332a and between the resin sealer 365 and the bottom of the recess 332b. There is accordingly a large degree of freedom in the depths of the recesses 332a and 332b formed in the base plate 330.

Figure 7:
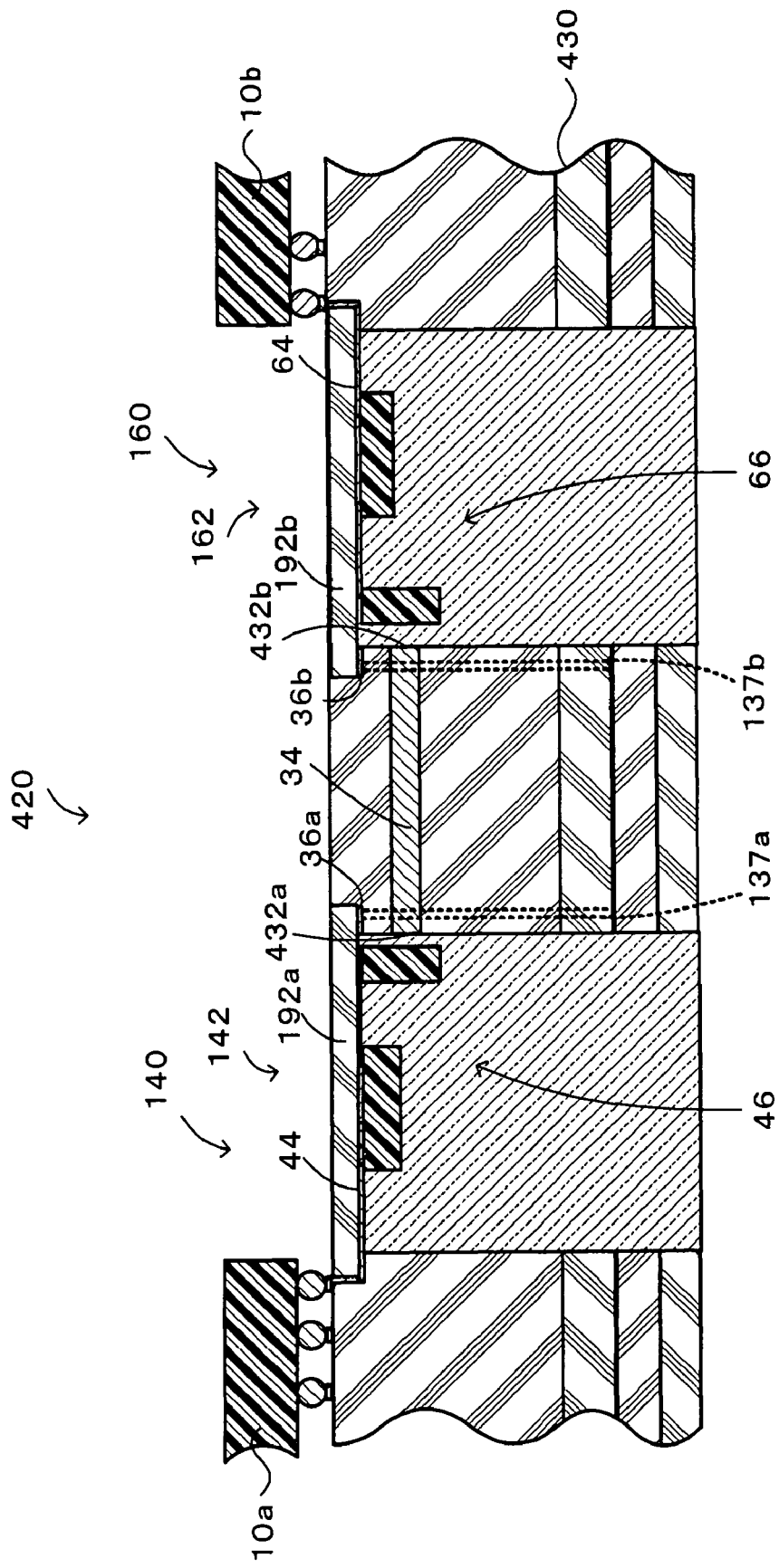
FIG. 7 shows the schematic configuration of a signal transmission device 420 in still another modified example.

In the signal transmission device 120 of the second embodiment, the through holes 132a and 132b having a substantially fixed width are formed from the surface of the base plate 130 in the direction of depth. FIG. 7 shows the structure of a signal transmission device 420 as one modified example with a base plate 430. Through holes 432a and 432b formed from the surface of the base plate 430 in the direction of depth have varied widths. The through holes 432a and 432b have an identical width with the width of the module mounts 192a and 192b from the surface of the base plate 430 to a certain depth corresponding to the height of the module mounts 192a and 192b and have an identical width with the width of the resin sealers 145 and 165 from the certain depth corresponding to the height of the module mounts 192a and 192b to the rear face of the base plate 430. This arrangement causes the surfaces of the photoelectric converter-sealed members 140 and 160 to be arranged in the substantially same plane as the surface of the base plate 430.

In the signal transmission device 120 of the second embodiment, the via holes 137a and 137b are formed in the base plate 130 to the depth of the wiring layer of internal wiring for power supply (not shown). The via holes 137a and 137b may be formed to penetrate from the surface to the rear face of the base plate 130. These penetrating via holes 137a and 137b are connectable with all wiring layers (not shown) of the base plate 130.

In the signal transmission device 120 of the second embodiment, the photoelectric conversion modules 142 and 162 and the wirings 44 and 64 are attached to the module mounts 192a and 192b. In one modified structure, various electronic parts, for example, a capacitor chip, a resistor chip, an IC, and LSI, are arranged on faces of the module mounts 192a and 192b opposed to the mounting surfaces of the module mounts 192a and 192b with the photoelectric conversion modules 142 and 162 and the wirings 44 and 64. The electronic parts may be electrically connected with the photoelectric conversion modules 142 and 162 attached to the module mounts 192a and 192b through wirings passing through via holes (not shown) formed in the module mounts 192a and 192b. The module mounts 192a and 192b may be constructed as multi-layered circuit boards.

In the signal transmission device 120 of the second embodiment, the wirings 44 and 64 from the photoelectric conversion modules 142 and 162 are connected via the connection terminals 194a and 194b with the LSI packages 10a and 10b mounted on the surface of the base plate 130. In one modification, the wirings 44 and 64 from the photoelectric conversion modules 142 and 162 may be connected with signal wiring layers provided inside the base plate 130 for transmission of high-frequency signals by means of predetermined wirings, which are arranged in via holes formed from the surface of the base plate 130 to the signal wiring layers and are electrically connected with the wirings 44 and 64 from the photoelectric conversion modules 142 and 162. In another modification, the wirings 44 and 64 from the photoelectric conversion modules 142 and 162 may be connected with the LSI packages 10a and 10b mounted on the rear face of the base plate 130 by means of predetermined wirings, which are arranged in via holes penetrating from the surface to the rear face of the base plate 130 and are electrically connected with the wirings 44 and 64 from the photoelectric conversion modules 142 and 162. Such modification allows the connection of the wirings 44 and 64 from the photoelectric conversion modules 142 and 162 with the signal wiring layers provided inside the base plate 130 or with the LSI packages 10a and 10b mounted on the rear face of the base plate 130 by simply forming the via holes. This arrangement desirably enhances the high frequency characteristics of signal transmission.

In the signal transmission device 120 of the second embodiment, the laser diodes 47 and the driving IC 48 of the photoelectric conversion module 142 and the photo diodes 67 and the amplification IC 68 of the photoelectric conversion module 162 are sealed with the resin sealers 145 and 165 and the module mounts 192a and 192b. The resin sealers 145 and 165 may be formed in any shape to work in cooperation with the module mounts 192a and 192b and seal at least the laser diodes 47, the driving IC 48, the photo diodes 67, and the amplification IC 68. For example, one resin sealer may be provided in a shape of covering over the laser diodes 47 of the photoelectric conversion module 142, and another resin sealer may be provided in a shape of covering over the driving IC 48 of the photoelectric conversion module 142. The laser diodes 47 and the driving IC 48 of the photoelectric conversion module 142 are sealed with these resin sealers and the module mount 192a.

Figure 8:
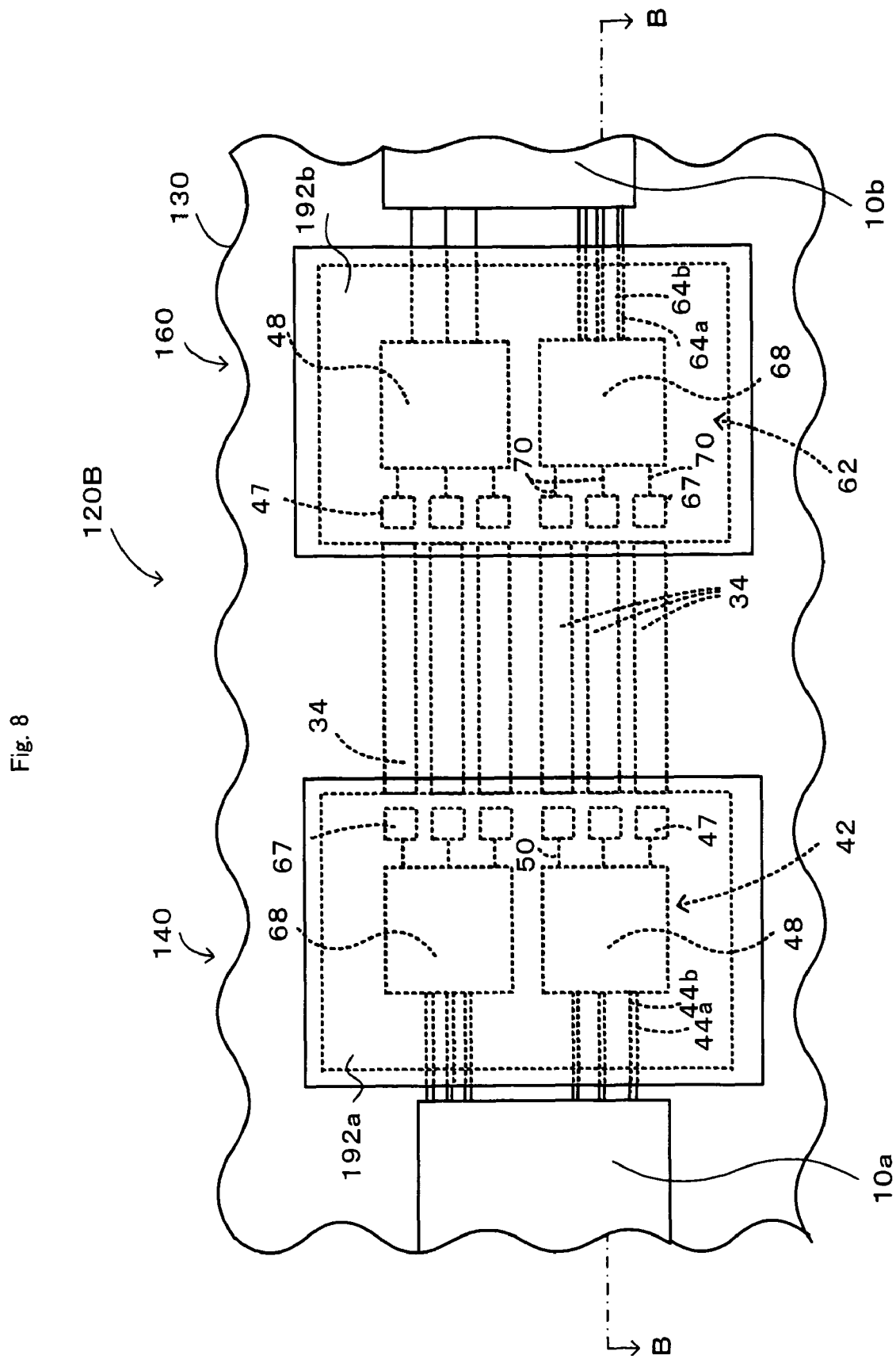
FIG. 8 is a plan view showing the schematic configuration of a signal transmission device 120B in another modified example.

FIG. 8 shows the structure of a signal transmission device 120B as one modified example with regard to the electric-optical converters 46 and the optical-electric converters 66 included in the photoelectric conversion modules 42 and 62 in the signal transmission device 20 of the first embodiment or included in the photoelectric conversion modules 142 and 162 in the signal transmission device 120 of the second embodiment. In the electric-optical converter 46 of this modified example, the driving IC 48 is placed close to the laser diodes 47. The driving IC 48 is then linearly connected with the laser diodes 47 by patterned wirings 50 or by wire bonding (not shown). In the optical-electric converter 66 of this modified example, the amplification IC 68 is placed close to the photo diodes 67. The amplification IC 68 is then linearly connected with the photo diodes 67 by patterned wirings 70 or by wire bonding (not shown). This modified structure relatively shortens the wiring lengths of the patterned wirings 50 and 70 to, for example, several millimeter levels and allows relatively high-speed transmission of electric signals between the laser diodes 47 and the driving IC 48 and between the photo diodes 67 and the amplification IC 68. In this modified example, two wirings 44a and 44b arranged close to each other and in parallel to each other are used for connecting the driving IC 48 with the LSI package 10a, in place of the wiring 44 in the signal transmission device 120 of the second embodiment. Similarly two wirings 64a and 64b arranged close to each other and in parallel to each other are used for connecting the amplification IC 68 with the LSI package 10b, in place of the wiring 64 in the signal transmission device 120 of the second embodiment. There is accordingly differential signal transmission between the driving IC 48 and the LSI package 10a and between the amplification IC 68 and the LSI package 10b. The differential signal transmission desirably prevents the quality of the signal from being worsened, while allowing high-speed signal transmission between the driving IC 48 and the LSI package 10a and between the amplification IC 68 and the LSI package 10b. This arrangement thus ensures signal transmission from the LSI package 10a to the LSI package 10b at a high speed of, for example, several hundred Mbps to several ten Gbps. The laser diodes 47 and the driving IC 48 are mounted on one identical photoelectric conversion module 42, so that the temperature of the laser diodes 47 is practically equivalent to the temperature of the driving IC 48. The temperature-based operational change is thus subject to feedback control on the assumption that the laser diodes 47 and the driving IC 48 have the same temperature condition. Similarly the photo diodes 67 and the amplification IC 68 are mounted on one identical photoelectric conversion module 62. The temperature-based operational change is thus subject to feedback control on the assumption that the photo diodes 67 and the amplification IC 68 have the same temperature condition. These photoelectric conversion modules 42 and 62 are sealed with the resin sealers 145 and 165. There are relatively short wiring lengths of the patterned wirings 50 between the laser diodes 47 and the driving IC 48 and the patterned wirings 70 between the photo diodes 67 and the amplification IC 68. This arrangement effectively reduces electromagnetic interferences from the photoelectric conversion modules 42 and 62 to the outside, as well as electromagnetic interferences from the outside to the photoelectric conversion modules 42 and 62.

In the signal transmission device 20 of the first embodiment or the signal transmission device 120 of the second embodiment, each of the photoelectric conversion modules 42 and 62 or the photoelectric conversion modules 142 and 162 has one electric-optical converter 46 and one optical-electric converter 66. Each of the photoelectric conversion modules 42 and 62 or the photoelectric conversion modules 142 and 162 may have multiple electric-optical converters 46 and multiple optical-electric converters 66. Each of the photoelectric conversion modules 42 and 62 or the photoelectric conversion modules 142 and 162 may have only either the electric-optical converter 46 or the optical-electric converter 66. In the last case, one module converts electric signals into light signals and inputs the light signals to the optical waveguides 34, while the other module receives light signals from the optical waveguides 34 and converts the received light signals into electric signals. For example, the photoelectric conversion module 42 has only the electric-optical converter 46, while the photoelectric conversion module 62 has only the optical-electric converter 66. In another example, the photoelectric conversion module 62 has only the electric-optical converter 46, while the photoelectric conversion module 42 has only the optical electric converter 66.

In the signal transmission device 20 of the first embodiment or the signal transmission device 120 of the second embodiment, the photoelectric conversion modules 42 and 62 or the photoelectric conversion modules 142 and 162 are connected with the signal pins 12a and 12b of the LSI packages 10a and 10b having the relatively high-speed data output capabilities. The photoelectric conversion modules 42 and 62 or the photoelectric conversion modules 142 and 162 may alternatively be connected with signal pins of the LSI packages 10a and 10b having relatively low-speed data output capabilities.

In the signal transmission device 20 of the first embodiment or the signal transmission device 120 of the second embodiment, the recesses 32a and 32b or the through holes 132a and 132b are sealed with the resin sealers 45 and 65 or the resin sealers 145 and 165 made of the translucent epoxy resin. The resin sealers 45 and 65 or the resin sealers 145 and 165 may be made of any other suitable translucent material. In a modified structure where the resin sealers 45 and 65 or the resin sealers 145 and 165 are not interposed between the laser diode 47 and the optical waveguide 34 or between the photo diode 67 and the optical waveguide 34, the light signal from the laser diode 47 is directly input into the optical waveguide 34 and the light signal from the optical waveguide 34 is directly input into the photo diode 67. In this modified structure, the resin sealers 45 and 65 or the resin sealers 145 and 165 may be made of a non-translucent epoxy resin or any other suitable non-translucent material.

In the signal transmission device 20 of the first embodiment or the signal transmission device 120 of the second embodiment, the electric-optical converter 46 included in the photoelectric conversion modules 42 and 62 or the photoelectric conversion modules 142 and 162 has the laser diodes 47 arranged to emit the light signal in the planar direction of the base plate 30 or the base plate 130. The laser diode 47 may be replaced with another suitable light emitting element driven by an electric signal to emit the light signal in the planar direction of the base plate 30 or 130 or with a light emitting element driven to emit the light signal in a depth direction perpendicular to the planar direction of the base plate 30 or 130. In this latter modification, a mirror should be provided to change the direction of the light signal emitted from the light emitting element from the depth direction to the planar direction and input the light signal of the changed direction into the optical waveguide 34.

In the signal transmission device 20 of the first embodiment or the signal transmission device 120 of the second embodiment, no lens for focusing the light onto the optical waveguide 34 or onto the photo diode 67 is provided at a site of inputting the light signal from the laser diode 47 in the electric-optical converter 46 of the photoelectric conversion module 42, 62, 142, or 162 into the optical waveguide 34 or at a site of inputting the light signal from the optical waveguide 34 into the photo diode 67. Such focusing lenses may, however, be provided at these sites.

In the signal transmission device 20 of the first embodiment or the signal transmission device 120 of the second embodiment, the optical-electric converter 66 included in the photoelectric conversion modules 42 and 62 or the photoelectric conversion modules 142 and 162 has the photo diodes 67 arranged to receive the light signal in the planar direction of the base plate 30 or the base plate 130. The photo diode 67 may be replaced with another suitable light receiving element designed to receive the light signal in the planar direction of the base plate 30 or 130 and convert the received light signal into an electric signal or a light receiving element designed to receive the light signal in a depth direction perpendicular to the planar direction of the base plate 30 or 130. In this latter modification, a mirror should be provided to change the direction of the light signal output from the optical waveguide 34 from the planar direction to the depth direction and input the light signal of the changed direction into the light receiving element.

In the signal transmission device 20 of the first embodiment or the signal transmission device 120 of the second embodiment, the multiple optical waveguides 34 are arranged in parallel with one another in the planar direction of the base plate 30 or 130. As illustrated in a signal transmission device 520 of FIG. 9 given as a modified example with a base plate 530 and photoelectric converter-sealed members 540 and 560, multiple optical waveguides 34 may be arranged in parallel with one another in a depth direction of the base plate 530. In this modified structure, multiple laser diodes 47 and multiple photo diodes 67 are arrayed in the depth direction of the base plate 530 and are attached to upright jigs 596a and 596b in each of photoelectric conversion modules 542 and 562 of the photoelectric converter-sealed members 540 and 560.

The signal transmission device 20 of the first embodiment or the signal transmission device 120 of the second embodiment has the six optical waveguides 34. There is, however, no limit in number of the optical waveguides 34. There may be more than six optical waveguides 34 or less than six optical waveguides 34, even only one optical waveguide 34. Each of the photoelectric conversion modules 42 and 62 or 142 and 162 is require to have a corresponding number of the laser diodes 47 and a corresponding number of the photo diodes 67 to the number of the optical waveguides 34. For example, when there is only one optical waveguide 34, the photoelectric conversion module 42 may have only one laser diode 47, while the photoelectric conversion module 62 may have only one photo diode 67.

In the signal transmission device 20 of the first embodiment or the signal transmission device 120 of the second embodiment, the optical waveguides 34 are formed in the planar direction of the base plate 30 or the base plate 130. The optical waveguides 34 may, however, be formed in any suitable direction of the base plate 30 or 130. In such modification, the recesses 32a and 32b of the base plate 30 or the through holes 132a and 132b of the base plate 130 should be arranged to expose the respective ends of the optical waveguides 34. The photoelectric converter-sealed members 40 and 60 or 140 and 160 should then be placed in the recesses 32a and 32b or in the through holes 132a and 132b to ensure input and output of light signals between the photoelectric conversion modules 42 and 62 or 142 and 162 and the optical waveguides 34.

In the signal transmission device 20 of the first embodiment or the signal transmission device 120 of the second embodiment, the LSI packages 10a and 10b are mounted on the base plate 30 or the base plate 130, and the photoelectric conversion modules 42 and 62 or 142 and 162 are connected with the LSI packages 10a and 10b. Any other suitable electronic parts, for example, ICs, capacitor chips, resistor chips, or electric connectors electrically connectable with a cable of another device, may be mounted on the base plate 30 or the base plate 130.

The embodiments and their modified examples discussed above are to be considered in all aspects as illustrative and not restrictive. There may be many other modifications, changes, and alterations without departing from the scope or spirit of the main characteristics of the present invention.

INDUSTRIAL APPLICABILITY

The technique of the present invention is preferably applied to the manufacturing industry of signal transmission devices.

The invention claimed is:

1. A signal transmission device constructed to transmit a signal, the signal transmission device comprising:
   a base plate structured to have an optical waveguide formed internally, an opening formed to expose the optical waveguide, and a mounting surface provided to allow an electronic part to be mounted thereon at a different position from where the opening is formed; and
   a photoelectric converter-sealed member placed in the opening of the base plate to include a photoelectric conversion module for converting between an electric signal and a light signal and provided by sealing at least the photoelectric conversion module with a predetermined material to expose at least part of a wiring from the photoelectric conversion module on a substantially identical plane with an opening end face of the opening of the base plate,
   wherein the opening of the base plate is either a recess formed in a direction of depth of the base plate from the mounting surface for mounting the electronic part or a through hole pierced from the mounting surface to a rear face of the base plate opposed to the mounting surface, and
   the photoelectric converter-sealed member has a sealer made of the predetermined material, and a module mount arranged on a face of the sealer on the same side as the mounting surface and configured to have the photoelectric conversion module and the wiring attached thereto and to work in cooperation with the predetermined material to seal the photoelectric conversion module.

2. The signal transmission device in accordance with claim 1, wherein the module mount has a connection terminal arranged to electrically connect the wiring with a terminal provided at an outer circumference of at least part of the opening on the mounting surface of the base plate.

3. The signal transmission device in accordance with claim 1, wherein the photoelectric conversion module has a photoelectric conversion element arranged to allow input and output of a light signal from and to the optical waveguide and to convert between the light signal and an electric signal, and an electronic circuit configured to input and output the electric signal from and to the photoelectric conversion element.

4. The signal transmission device in accordance with claim 3, wherein the photoelectric conversion module has the electronic circuit located close to the photoelectric conversion element and linearly connected with the photoelectric conversion element by means of an inner-module wiring.

5. The signal transmission device in accordance with claim 1, wherein the optical waveguide is formed in a planar direction of the base plate.

* * * * *